(12) United States Patent
Wang (10) Patent No.: US 9,231,622 B2
(45) Date of Patent: *Jan. 5, 2016

(54) ENCODING METHODS AND SYSTEMS FOR BINARY PRODUCT CODES

(71) Applicant: Broadcom Corporation, Irvine, CA (US)

(72) Inventor: Zhongfeng Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 169 days.

This patent is subject to a terminal disclaimer.

(21) Appl. No.: 13/930,909

(22) Filed: Jun. 28, 2013

(65) Prior Publication Data

US 2015/0006990 A1 Jan. 1, 2015

Related U.S. Application Data

(63) Continuation of application No. 13/324,866, filed on Dec. 13, 2011, now Pat. No. 8,499,219.

(51) Int. Cl.
| | | |
|---|---|---|
| *G06F 11/00* | (2006.01) | |
| *H03M 13/00* | (2006.01) | |
| *H03M 13/29* | (2006.01) | |
| *H03M 13/15* | (2006.01) | |

(52) U.S. Cl.
CPC ........ *H03M 13/2909* (2013.01); *H03M 13/152* (2013.01); *H03M 13/1595* (2013.01); *H03M 13/2903* (2013.01); *H03M 13/6575* (2013.01)

(58) Field of Classification Search
CPC .......... H03M 13/152; H03M 13/1595; H03M 13/2903; H03M 13/2909; H03M 13/6575
See application file for complete search history.

(56) References Cited

U.S. PATENT DOCUMENTS

| 4,719,628 A * | 1/1988 | Ozaki et al. ................... 714/755 |
| 5,040,179 A | 8/1991 | Chen |
| 7,793,190 B1 | 9/2010 | Gray et al. |
| 8,020,063 B2 | 9/2011 | Olaker et al. |
| 8,065,585 B1 * | 11/2011 | Abbaszadeh et al. ......... 714/752 |
| 2005/0053285 A1 * | 3/2005 | Linkewitsch ................. 382/232 |
| 2010/0241925 A1 | 9/2010 | Wang et al. |
| 2010/0241926 A1 | 9/2010 | Wang et al. |

OTHER PUBLICATIONS

F. Polkinghorn, Jr., Decoding of Double and Triple Error Correcting Bose-Chaudhuri Codes, Correspondence, pp. 480-481, U.S. Naval Research Labs, Washington, D.C., Dated: 1966.

K. Lee, et al., A High-Speed Low-Complexity Concatenated BCH Decoder Architecture for 100 Gb/s Optical Communications, J. Sign Process Syst., Springer, Published online Aug. 2010.

K. Seki, et al., Single-Chip FEC Codec Using a Concatenated BCH Code for 10 Gb/s Long-Haul Optical Transmission Systems, IEEE 2003 Custom Integrated Circuits Conference, pp. 279-282, Dated: 2003.

H. Okano, et al., A Construction Method of High-Speed Decoders Using ROM's for Bose-Chaudhuri-Hocquenghem and Reed-Solomon Codes, IEEE Transactions on Computers, vol. C-36, No. 10, pp. 1165-1171, Oct. 1987.

* cited by examiner

*Primary Examiner* — Sam Rizk (74) *Attorney, Agent, or Firm* — Brinks Gilson & Lione (57) ABSTRACT

A data encoding circuit and a corresponding method is provided. The data encoding circuit includes a first data formatter in communication with an encoder section. The first data formatter is configured to receive blocks of source data in serial and output parallel two dimensional source data. The encoder receives the parallel two dimensional source data and that computes a plurality of serial row parity bits and a plurality of parallel column parity bits of an error correcting code from the parallel two dimensional source data. A second data formatter communicates with the encoder section and receives the parallel column parity bits and outputs serial column parity bits.

22 Claims, 9 Drawing Sheets

ENCODING METHODS AND SYSTEMS FOR BINARY PRODUCT CODES

CROSS REFERENCE TO RELATED APPLICATION

This disclosure is a continuation of U.S. application Ser. No. 13/324,866, filed on Dec. 13, 2011, which is hereby incorporated by reference in its entirety.

TECHNICAL FIELD

This disclosure relates generally to communication devices. More particularly, it relates to communication devices that employ binary product coding with a novel encoder architecture therein.

BACKGROUND

Data communication systems have been under continual development for many years. One such type of communication system that has been of significant interest lately is a communication system that employs iterative error correction codes (ECGs) that operates in accordance with forward error correction (FEC). There are a variety of types of ECCs including the Reed-Solomon (RS) code, turbo codes, turbo trellis code modulation (TTCM) code, LDPC (Low Density Parity Check) code, and other codes. Communications systems with iterative codes are often able to achieve lower bit error rates (BER) than alternative codes for a given signal to noise ratio (SNR).

A continual and primary directive in this area of development has been to try to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

Generally speaking, within the context of communication systems that employ ECCs, there is a first communication device at one end of a communication channel with encoder capability and second communication device at the other end of the communication channel with decoder capability. In many instances, one or both of these two communication devices includes encoder and decoder capability (e.g., within a bi-directional communication system). ECCs can be applied in a variety of additional applications as well, including those that employ some form of data storage (e.g., hard disk drive (HDD) applications and other memory storage devices) in which data is encoded before writing to the storage media, and then the data is decoded after being read/retrieved from the storage media.

BRIEF DESCRIPTION OF THE DRAWINGS

The system may be better understood with reference to the following drawings and description. In the figures, like reference numerals designate corresponding parts throughout the different views.

DETAILED DESCRIPTION

The description below relates to encoder architecture for binary product codes. It has been shown that binary product codes not only can achieve near-optimal decoding performance, but also well suit ultra-high speed (e.g., 100 Gbps or greater) applications. In practice, almost all enhanced FEC codes used in 10 Gbps and beyond OTN (optical transport network) products are product codes. The disclosed encoder structure may be modified slightly to implement other coding schemes.

Figure 1:
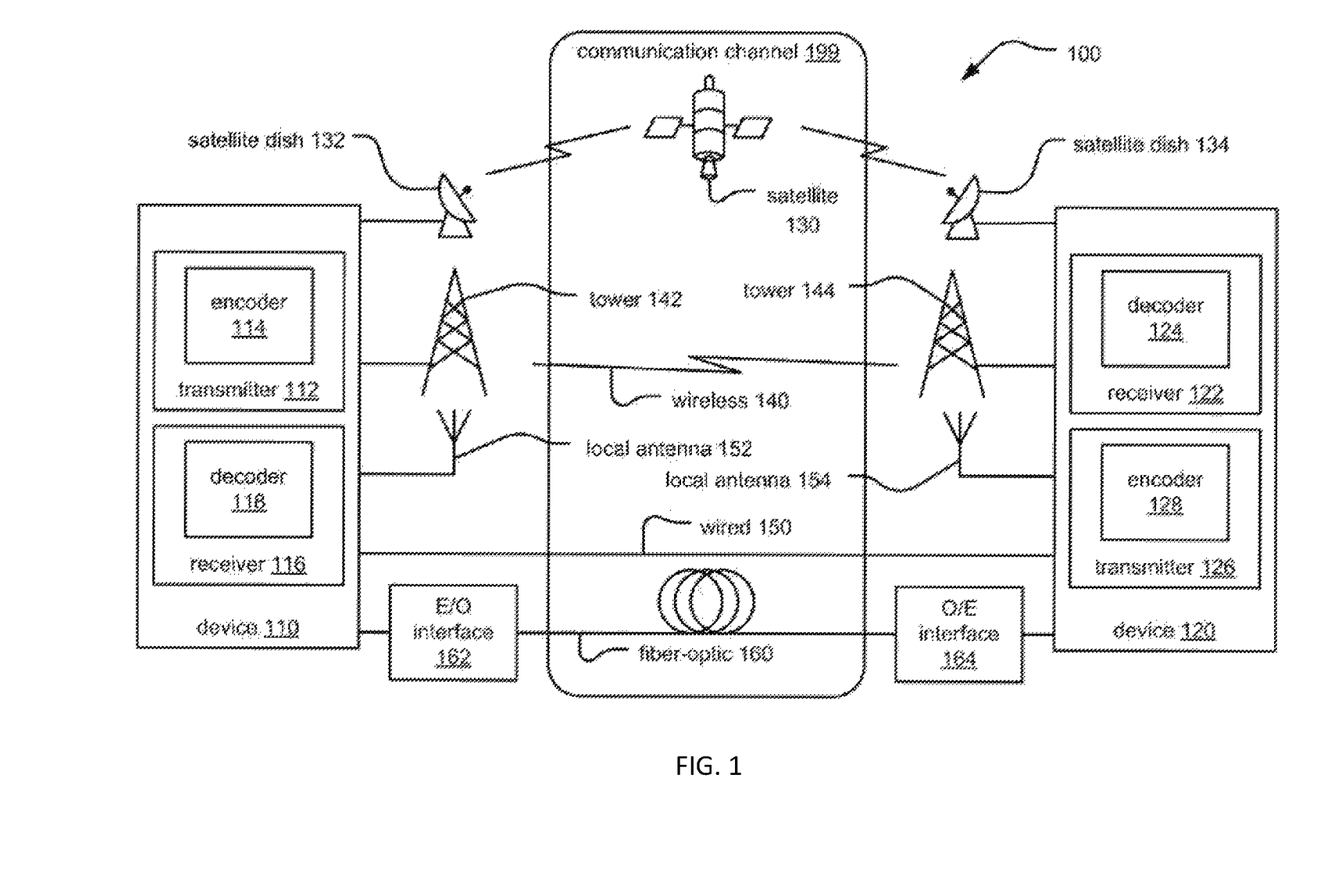
FIG. 1 and FIG. 2 show various embodiments of communication systems.
Figure 2:
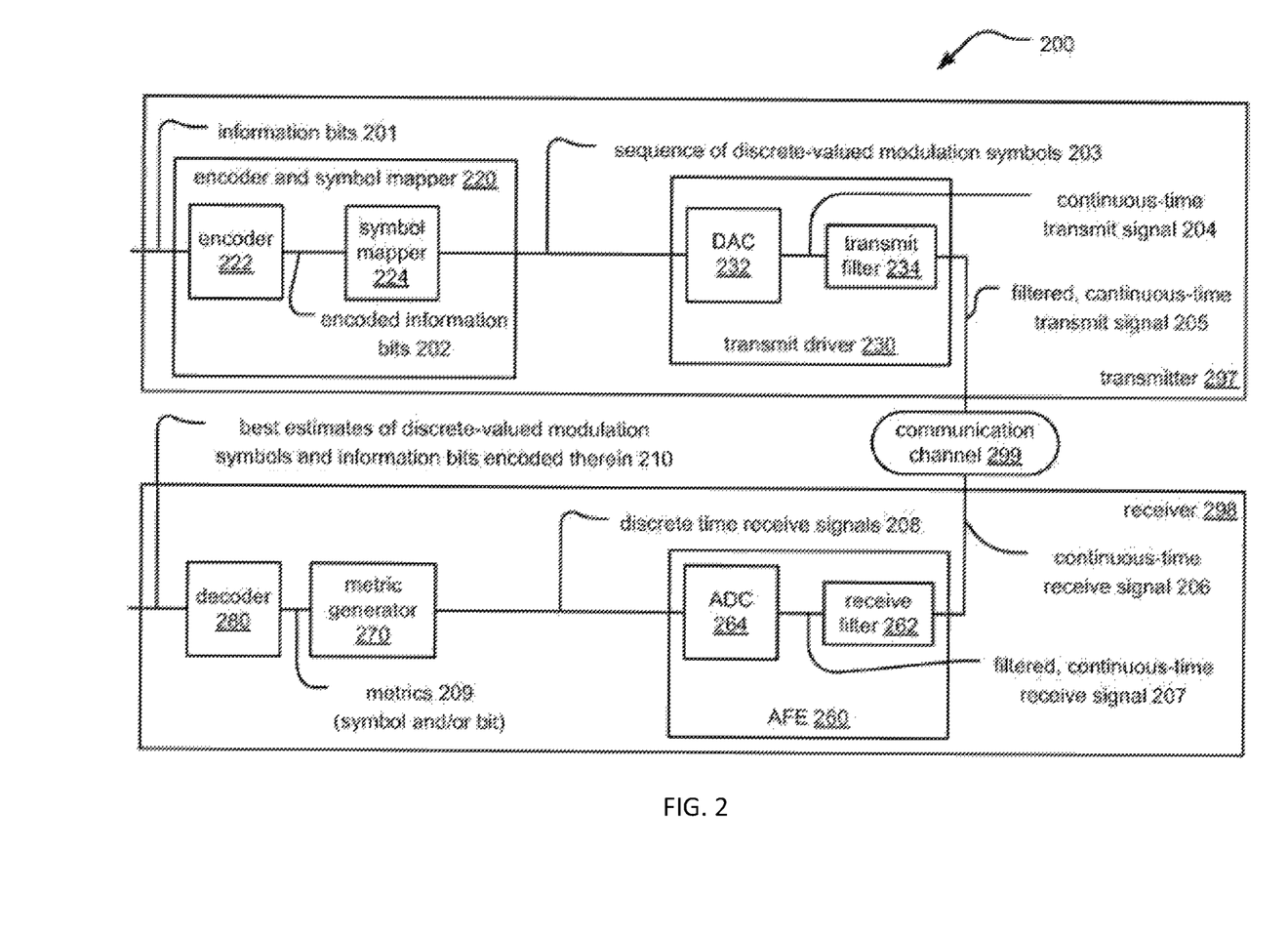

FIG. 1 and FIG. 2 illustrate various embodiments of communication systems including communicating devices with encoders.

FIG. 1 shows one example of a communication system 100 with a communication channel 199 that communicatively couples a communication device 110 situated at one end of the communication channel 199 to another communication device 120 at the other end of the communication channel 199. The communication device 100 includes a transmitter 112 having an encoder 114 and including a receiver 116 having a decoder 118. The communication device 120 includes a transmitter 126 having an encoder 128 and including a receiver 122 having a decoder 124. In some embodiments, either of the communication devices 110 and 120 may only include a transmitter or a receiver. Also, either of the communication devices 110 and 120 may include multiple transmitters or receivers. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Any of the various types of coding described herein can be employed within any such desired communication system (e.g., including those variations described with respect to FIG. 1), any information storage device (e.g., hard disk drives (HDDs), network information storage devices and/or servers, etc.) or any hardware or software application in which information encoding and/or decoding is desired.

FIG. 2 shows one example of a communication system 200 including a transmitter 297 and a receiver 298 communicating through a communication channel 299. The transmitter 297 encodes information bits 201 in an encoder 222 and a symbol mapper 224 thereby generating a sequence of discrete-valued modulation symbols 203. After encoding, the sequence of discrete-valued modulation symbols 203 is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. The transmit driver 230 may perform any necessary front end processing of a signal received from a communication channel (e.g., including any one or digital to analog conversion, gain adjustment, filtering, frequency conversion, etc.) to generate the filtered, continuous-time transmit signal 205.

At a receiving end of the communication channel 299, the receiver 298 receives continuous-time receive signal 206. The receiver 298 includes an Analog Front End (AFE) 260 that includes a receive filter 262 and an Analog to Digital Converter (ADC) 264. The receiver filter 262 outputs a filtered, continuous-time receive signal 207 to the ADC that generates discrete-time receive signals 208. The AFE 260 may perform any necessary front end processing of a signal received from a communication channel including any one of analog to digital conversion, gain adjustment, filtering, frequency conversion, etc. to generate a digital signal provided to a metric generator 270 that generates a plurality of metrics corresponding to a particular bit or symbol extracted from the received signal. The metric generator 270 calculates metrics 209 that are employed by a decoder 280 to make best estimates of the discrete-valued modulation symbols and information bits encoded therein 210.

The encoders and decoders of either of the previous embodiments may be implemented to include various aspects and/or embodiment of the disclosure therein. In addition, several of the following figures describe other and particular embodiments that may be used to support the devices, systems, functionality and/or methods that may be implemented in accordance with certain aspects of the disclosure.

Various types of error correction codes (ECGs) may be employed herein. For example, any one or more of any type or variant of Reed-Solomon (RS) code, turbo code, turbo trellis code modulation (TTCM) code, Low Density Parity Check (LDPC) code, Bose and Ray-Chaudhuri, and Hocquenghem (BCH) code, etc. Moreover, as will be illustrated in various embodiments herein, more than one ECC and/or more than one type of ECC may be employed when generating a single encoded signal in accordance with the principles presented herein. For example, certain of the embodiments presented herein operate as product codes, in which an ECC is employed more than once or more than one type of ECC is employed (e.g., a first ECC during a first time and a second ECC at a second time) to generate an encoded signal.

Moreover, both systematic encoding and non-systematic encoding may be performed in accordance with the various principles presented herein. Systematic encoding preserves the information bits being encoded and generates corresponding redundancy/parity bits (i.e., redundancy and parity may be used interchangeably herein); for example, the information bits being encoded are explicitly shown/represented in the output of non-systematic encoding. Non-systematic encoding does not necessarily preserve the information bits being encoded and generates coded bits that inherently include redundancy parity information therein; for example, the information bits being encoded need not be explicitly shown/represented in the output of non-systematic encoding. While many of the embodiments shown herein refer to systematic encoding, it is note that non-systematic encoding may alternatively, be performed in any embodiment without departing from the scope and spirit of the disclosure.

Certain embodiments of communication device and methods operating in accordance with the principles presented herein are designed to maximize coding gain as high as possible while maintaining a reasonable or acceptable hardware complexity and power consumption. Moreover, certain embodiments (e.g., to be compliant in accordance with a certain standard or communication protocol), certain constraints such as bit error rate (BER) or block error rate (BLER), redundancy rate or code rate, bit rates, throughput, etc. For example, one embodiment that operates in accordance with a 100 Giga-bits per second (Gbps) bit rate.

Figure 3:
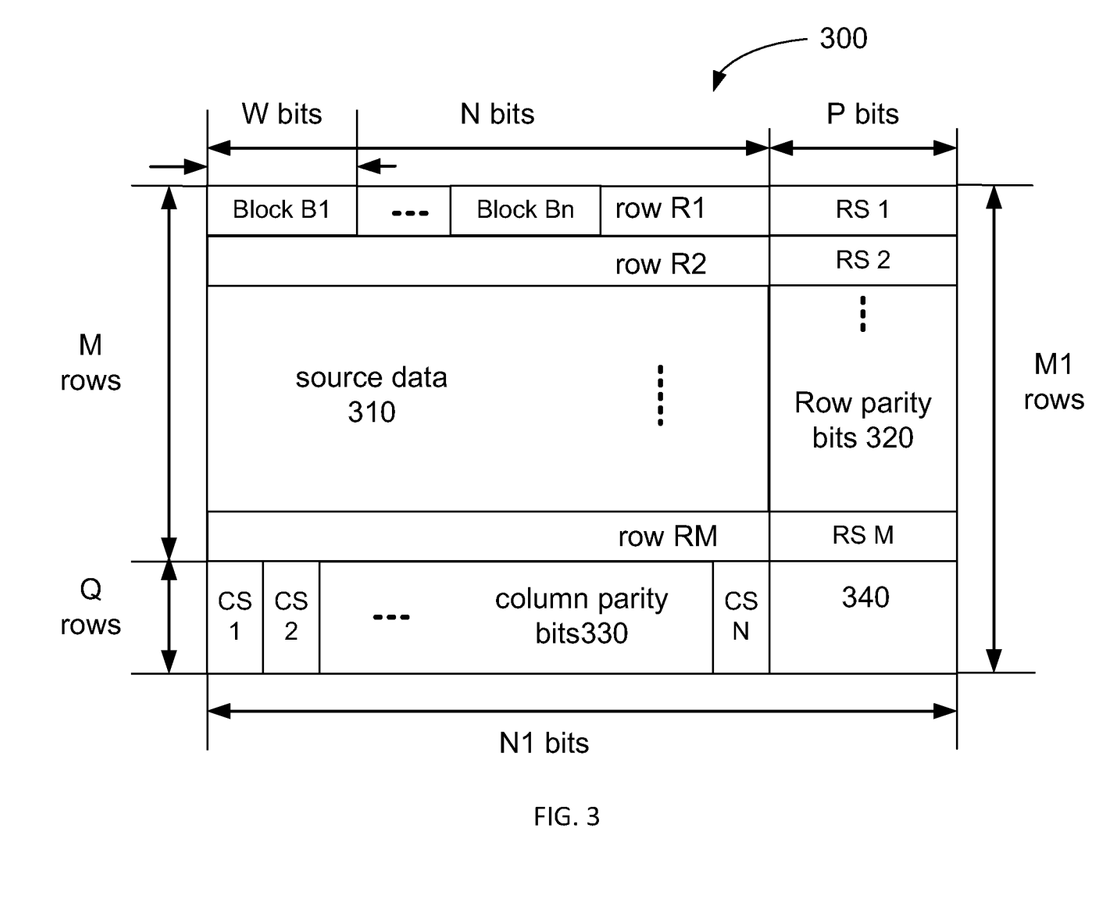
FIG. 3 shows an encoded data frame in accordance with one embodiment of the encoder.

FIG. 3 shows an encoded data frame 300 in accordance with one example embodiment of the encoder. The encoded data frame 300 includes source data 310, row parity bits 320, and column parity bits 330. The row parity bits 320 include M rows of parity bits RS1, RS2, . . . RSM generated by row encoding and the column parity bits 330 include N columns of parity bits CS1, CS2, . . . CSN generated by column encoding. There are P parity bits in each row RS1, RS2, . . . RSM. There are Q parity bits in each column CS1, CS2, . . . CSN. The row parity bits 320 may further include extra parity bits in each row and the column parity bits 330 may further include extra column parity bits in each column. The encoded data frame 300 may further include parity-of-parity part 340.

In this embodiment, the illustrated source data 310 have M rows of source data. Each row has N bits of source data. The N bits of source data in each row may further be divided to source data blocks B1, B2 . . . Bn. The number of blocks may or may not be an integer in each row of source data. For example, the source data 310 may have M=956 rows and each row has N=960 bits. When each source data block has 128 bits, each row includes 960/128=7.5 blocks. The encoded data frame has M1=987 row codes and N1=992 column codes plus 96 spare bits. Thus, each row parity bits 320 has P=N1−N=992−960=32 parity bits and each column parity bits 340 has Q=M1−M=987−956=31 parity bits. In this example, the row code is BCH (992, 960, t=3) and the column code is BCH (987, 956, t=3). The row code may have 2 extra parity bits compared to a conventional block code (e.g., t=3 BCH code). One example of the code generate polynomial can be chosen as $gr(x)=g3(x)*(1+x^2)$, where $g3(x)$ represents the code generate polynomial for a traditional t=3 BCH code defined over a finite field or a Galois field $GF(2^{10})$. For example, $g3(x) = m_1(x)*m_3(x)*m_5(x)$, where $$m_1(x)=x^{10}+x^3+1;$$

$$m_3(x)=x^{10}+x^3+x^2+x+1; \text{ and}$$

$$m_5(x)=x^{10}+x^8+x^3+x^2+1.$$

The column code may have 1 extra parity bit. One example of the column code generate polynomial can be chosen as $gc(x)=g3(x)*(1+x)$. More details about the encoding process can be found in U.S. patent application Ser. No. 12/726,062.

Figure 4:
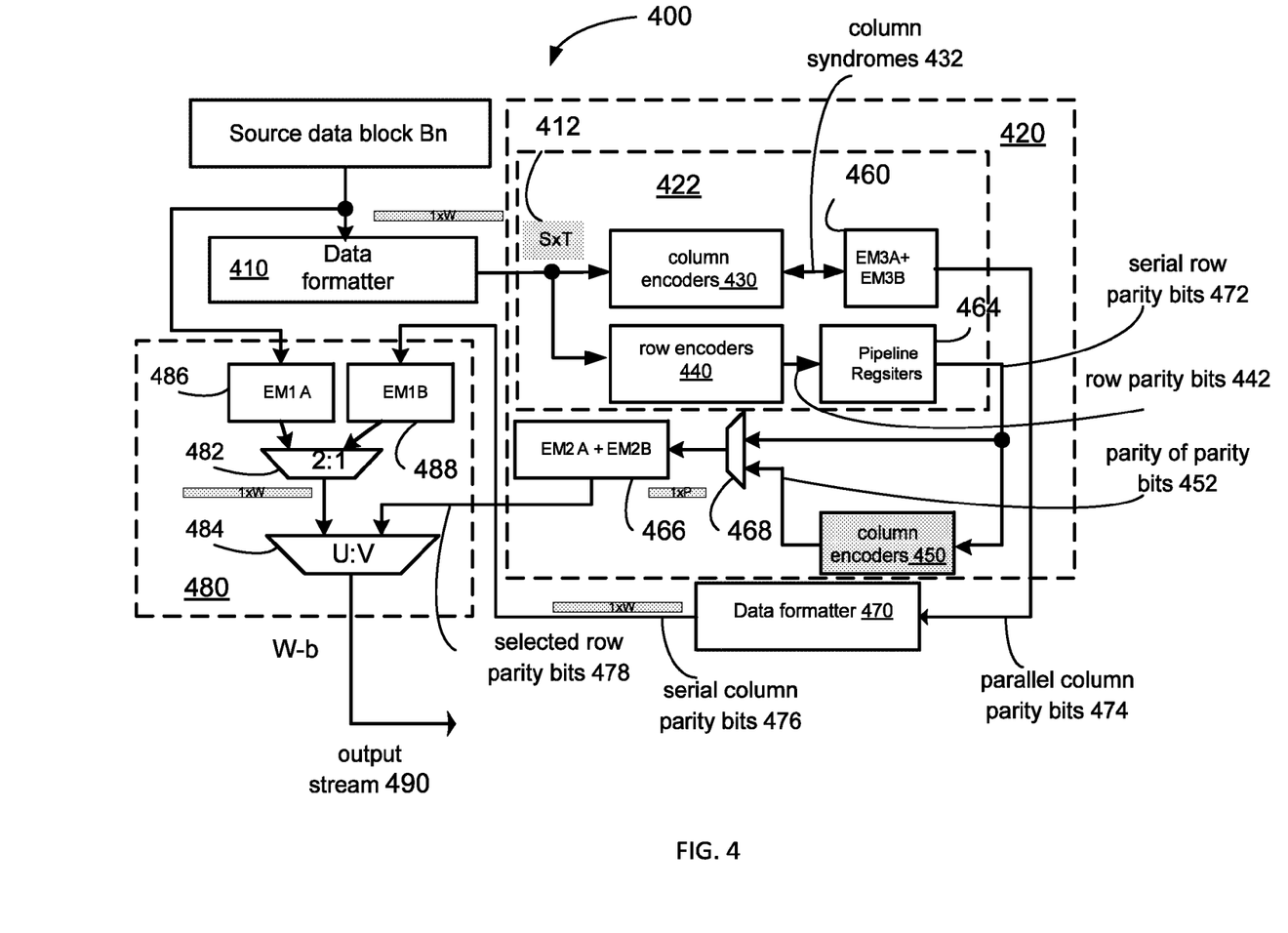
FIG. 4 shows a top-level architecture of an embodiment of the encoder.

FIG. 4 shows a top-level architecture 400 of an embodiment of the encoder. The top-level architecture of the encoder 400 includes a first data formatter 410 configured to receive blocks of source data Bn in serial and output parallel two dimensional source data 412 having S rows and T columns. Each block of source data Bn has W bits in a 1 by W data single row matrix as illustrated in FIG. 3, where W=S*T. Thus the first data formatter 410 needs to buffer at least (S−1) full rows and T bits of the Sth row of source data in each frame of the error correcting code before outputting the parallel two dimensional source data 412 as S rows of T columns. Note that because each block of source data Bn has W bits, the block of source data are in parallel format in each block. The first data formatter 410 received blocks of source data Bn one by one.

The encoder 400 also includes an encoder section 420 in communication with the first data formatter 410 that receives the parallel two dimensional source data 412 and that computes a plurality of serial row parity bits 472 and a plurality of parallel column parity bits 474 of an error correcting code from the parallel two dimensional source data 412. The encoder section 420 includes a first encoding module 422 configured to encode the parallel two dimensional source data 412 along a row direction and a column direction thereby generating the plurality of serial row parity bits 472 and the plurality of parallel column parity bits 474. The first encoding module 422 includes at least one column encoder 430 and one row encoder 440. The column encoder 430 generates and updates column parity bits 432 along column direction for each two dimensional source data 412. The row encoder 440 generates and updates row parity bits 442 along row direction for each two dimensional source data 412. In one embodiment, the first encoding module 422 includes S row encoders and T column encoders. The encoder section 420 includes a second encoding module 450 configured to receive M pluralities of serial row parity bits 472 and encode the received M pluralities of serial row parity bits 472 along the column direction thereby generating a plurality of parity of parity bits 452, and wherein M is a total number of rows in each frame of source data as illustrated in FIG. 3.

At least one of the S row encoders 440 and T column encoders 430 implement a BCH binary code or any other similar coding scheme. The T column encoders 430 output the plurality of column parity bits 432 to a pair of alternately accessed memories EM3A+EM3B 460. The S row encoders 440 output the plurality of row parity bits 442 to pipeline registers 464 that output the serial row parity bits 472 to a multiplexer 468 and additional column encoders 450.

The encoder 400 includes a second data formatter 470 in communication with the encoder section 420 that receives the parallel column parity bits 474 and outputs serial column parity bits 476 in a 1 by W data single row matrix format. The encoder 400 includes a multiplexer section 480 that multiplexes the blocks of source data Bn, the serial row parity bits 472, and the serial column parity bits 476 into an output stream 490 comprising the blocks of source data encoded by the error correcting code. The output data stream 490 is then packed into rows of the encoded data frame 300 as illustrated in FIG. 3 block by block from left to right. After a row is filled with the encoded data, the next output stream 490 is filled in the next row from top to bottom consecutively.

The disclosed architecture 400 may be applied for other binary product codes. In one embodiment, EM2A and EM2B 466 are a pair of ping-pong memories, and EM3A and EM3B 460 are another pair of ping-pong memories. Those ping-pong memories work in alternative modes in encoding two consecutive frames. For instance, for even frames, EM3A is used to perform column encoding, when odd frames are coming, EM3B is used to perform column encoding while EM3A is used to output encoded data of the previous frame (i.e., an even-index frame). These row and column encoders 430, 440, and 450 may be normal block code encoders, for example, BCH encoders. Since each component encoder gets multiple bits of input per cycle, conventional parallel block (BCH in this example) or any other kind of parallel block encoder architecture may be adopted. Note that the output of row encoders 440 feed memory EMB2A or EMB2B 466. The output of column encoders 450 also feed EMB2A or EMB2B 466. However, there is no memory access conflict here because the two outputs will not appear at the same time when encoding the same source data frame.

The multiplexer section 480 includes two memories EMB1A memory 486 and EMB1B memory 488. EMB1A memory 486 is used to store incoming source data and outputs the stored data after certain time delay. The size of EMB1A memory 486 can be small as new coming source data can overwrite the early stored source data if the time delay between storing and outputting first data is well scheduled. EMB1B memory 488 is used to output serial data stream of column encoders, which are output from data formatter 470. EMB1B memory 488 may be realized with memory or register files. For EMB1A memory 486, incoming data are stored in a cyclic way, e.g., when data reach the largest address of the memory, the next data will be stored in the lowest address of the memory. However, when an entire frame of source data is stored, the address pointer must be reset to the initial address, usually the lowest address of the memory. EMB1B memory 488 works also in a cyclic way.

In one embodiment, the delay between writing and reading first data to/from EMB1A memory 486 is slightly greater than a predetermined percentage of the total number of cycles for encoding a data frame. This predetermined percentage is determined based on a proportion of parity bits divided by the total number of bits in an entire coded data frame. The proportion of parity bits includes parity bits that are available only after the entire source data frame have gone through the product code encoder 400. For example, when the column code parity bits and parity of parity bits are only available after the entire frame of source data have gone through the product code encoder and those parity bits account for about 3.1% of the entire source data, the predetermined percentage is about 3.1%. In this example, when bus-width W is 256 bit, we need about (M1*N1/W=(987*992+96)/256=3825 cycles to transmit an entire coded frame. The minimum delay is about 3825*3.1%~=120. For easy memory addressing, we may allocate 128 entries for EMB1A memory 486.

Also, the average data rate for the input of the encoder 400 may be lower than the output of the encoder 400 due to added parity bits. In one embodiment, the same clock signal for both input and output sides are used. In this case, idle cycles may be added at input side of the encoder 400. For easy implementation, the incoming data stream may be converted into a form that the idle cycles are added substantially periodically with possibly minimum period. For instance, for SP-BCH code, the input data rate vs. output rate is 239/255. By calculation, this ratio is very close to 15/16. Thus, for a coded frame of SP-BCH code, one idle cycle is added after 15 cycles of valid data during a period of 16 cycles. In 3824 cycles, the number of valid data cycles is 3824*15/16=M*N/W=3585 cycles, which just completes the source data of entire frame. There is one idle cycle for the last cycle (i.e., 3825th cycles). Other timing schemes are also possible, for example, 1) adding 16 idle cycles after sending valid data for 239 cycles during each 255-cycle period, or 2) adding 2 cycles after sending valid data for 30 cycles during each 32-cycle period, and after 119 periods, sending 15 valid data and idle for 2 cycles to complete an entire frame encoding.

For EMB1B memory 488, the memory size may be very small depending on the design of data follow control from EM3A and EM3B 460 to the second data formatter 470 to EM1B memory 488. This entire control flow may be designed as need based and the size of EM1B memory 488 may be only a few entries with each entry consist of W (e.g., W=32) bits. For example, the data may be only pumped out to EM1B just right before the data is needed by multiplexor 484. Thus, EM1B memory 488 may be realized with registers due to a small storage size requirement.

The multiplexer section 480 also includes a first multiplexer array (or logic) 482 and a second multiplexer array (or logic) 484. The first multiplexer array 482 and the second multiplexer array 484 may have different number or same number of multiplexers. The number of multiplexers in the first multiplexer array 482 or the second multiplexer array 484 depends on the input data bus width. The first multiplexer array 482 multiplexes data from a memory system including memories EM1A memory 486 and EM1B memory 488. The second multiplexer 484 array multiplexes data from the first multiplexer array 482 and memory EM2A and EM2B 466. In one embodiment, the first multiplexer 482 includes a 2 select 1 multiplexer and the second multiplexer 484 includes a U select V multiplexer. In this embodiment, the source data block Bn has W bits, the parallel two dimensional source data 412 has S rows of T columns; the encoder section 420 includes S row encoders 440 and T column encoders 430, where W=S*T. The first multiplexer array 482 has W 2 select 1 multiplexors. The second multiplexer array 484 has P U select V multiplexors. Accordingly, the S row encoders computes P parity bits in each of the serial row parity bits, U and V is determined by a mathematical expression UN=(P+W)/W.

For example, when W=256, S=4 and T=64, the output of EM1A memory 486 and that of EM1B memory 488 will be multiplexed into a data stream of 256 bits per cycle feeding to the second multiplexer 484. The other input to the second multiplexer 484 is the output of data formatter 470. In one embodiment, the first set of input data to the multiplexer have 256 bits, the second set of data have 32 bits. When denoting each consecutive 32 bits of data as one group, the first input data set has 8 groups and the second input data set has 1 group. The final encoded data from the second multiplexer is an output data stream of 256 bits per cycle. Thus, the second multiplexer 484 may be realized with an array of 9 choose 8 multiplexers.

In one example of the illustrated top-level architecture 400, the bus-width W is 256 and the parallel two dimensional source data 412 has 4 rows and 64 columns. The disclosed architecture 400 may be extended to some other options with different bus-widths, e.g., with 128 bits as bus-width. The incoming source data first goes through first data formatter 410 that converts the incoming source data block Bn of 1×256 bits into a two dimensional source data array 412 of 4×64 bits. Herein, 1×256 bits denote the incoming data of 256 bits belong to 256 different columns in the coded data matrix of the SP-BCH code, 4×64 bits indicate that the 256-b data in the flow correspond to a data array of 4 rows and 64 columns in the coded data matrix. The first data formatter 410 may be realized with registers and multiplexors in VLSI.

Figure 5:
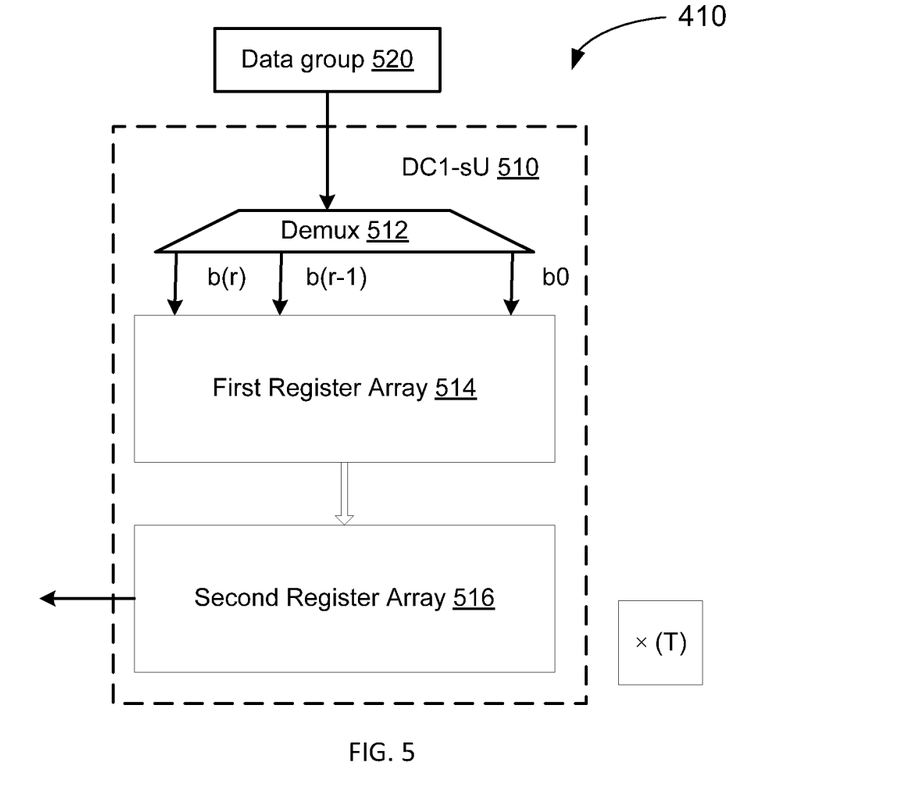
FIG. 5 shows one embodiment of a first data formatter of the disclosed encoder.

FIG. 5 shows one embodiment of the first data formatter 410. The embodiment includes a plurality of data converter sub-units (DC1-sU). Each DC1-sU includes a demux or a demultiplexer 512 that takes the input data group 520 and outputs them to a first register array 514. The first register array 514 works as a buffer and outputs data to a second register array 516 after it has been filled up. For example, the source data block Bn in FIG. 3 has 256 bits denoted as Xin[255:0] and divided into 64 data groups with each data group 520 includes 4 bits. In this embodiment, the first data formatter 410 includes 64 DC1-sU that formats each data group 520 respectively. The source data block Bn is arranged as the following: {Xin[255], Xin[255−64], Xin[255−2*64], Xin[255−3*64]} form the 4-bit input data group 520 to DC1 sub-unit-63 (denoted as DC1-sU63), {Xin[254], Xin[254−64],Xin[254−2*64], Xin[254−3*64]} form the 4-bit input data group 520 to DC1-sU62, . . . {Xin[192], Xin[192−64], Xin[192−2*64], Xin[192−3*64]} form the 4-bit input data group 520 to DC1 subunit-0 (DC1-sU0). In the output side of the data formatter 410, the 4-b output from each of 64 groups becomes one column in a 4×64 two dimensional source data array 412 starting from group-63 to group-0.

In this particular embodiment, the first register array 514 may be a vertical register array (V-RA) and the second register array 516 may be a horizontal register array (H-RA). For example, in each DC1-sU, the 4-b inputs data group 520 are cyclically sent to 15 locations at the input side of a V-RA. In the first cycle, the 4-b inputs data group 520 are sent to {b14, b13, b12, b11}, in the second cycle, the 4-b inputs data group 520 go to {b10, . . . , b7}, in fourth cycle, the 4-b inputs data group 520 go to {b2, b1, b0, b15}, etc. The V-RA works as a FIFO in vertical direction. After every 15 cycles, the V-RA 514 is fully filled and will be copied to the H-RA 513 immediately. The H-RA 516 then forms a FIFO in horizontal direction from right hand to left hand in order to pump data out in a predetermined two dimensional format. In the copying process, each bit in the V-RA 514 is copied to the same location (i-th row, j-th column) in the H-RA 516. Note that the number of waiting cycles 15 is obtained by S*N/W, where S=4, N=960, and W=256. The number of waiting cycles may be varied if any of the parameters S, N, or W changes.

As illustrated in FIG. 4, when the two dimensional source data array 412 has S rows and T columns, the first encoding module 422 needs S row encoders and T column encoders working in parallel to encode each row and column simultaneously. For example, when S=4 and T=64, the first encoding module 422 may use 4 row encoders and 64 column encoders. The S row encoders and T column encoders may be bit-serial BCH encoders, parallel BCH encoders, or the like. In some embodiments, the row encoders or column encoders may include a linear feedback shift register.

Figure 6:
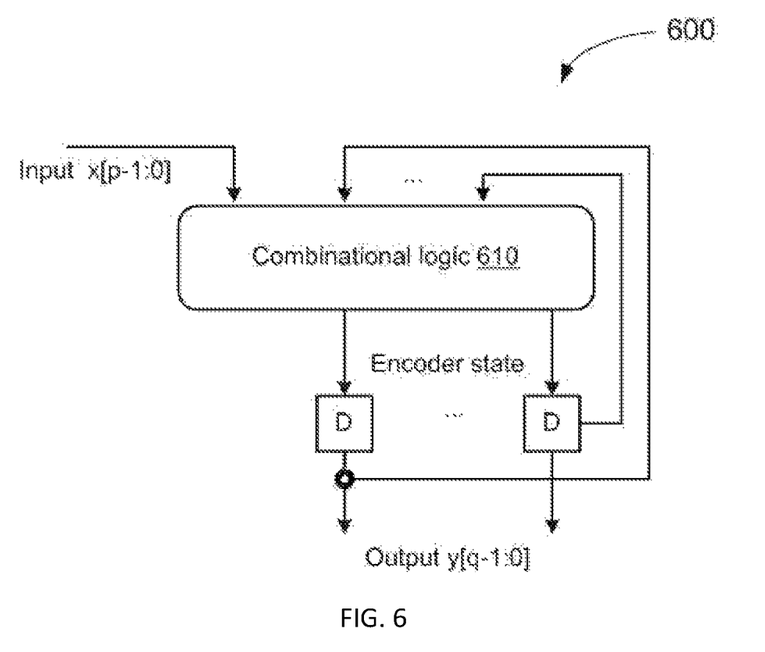
FIG. 6 shows a generic architecture for one embodiment of a parallel BCH encoder.

FIG. 6 shows a generic architecture for one embodiment of a parallel BCH encoder 600. The parallel BCH encoder 600 includes a combinational logic 610 such as a type of digital logic implemented by Boolean circuits. At each cycle, the combination logic 610 outputs a function of the input x[p-1:0] and the delayed output y[q-1:0], where p is the total number of input bits and q is the total number of parity bits. The parallel BCH encoder 600 has q-bit register to store the state. The parallel BCH encoder 600 may further include a plurality of delay units D such as shift registers. The initial output state of the combination logic 610 is set as 0. The combination logic 610 computes the next state based on the BCH code generator polynomial disclosed above.

Figure 7:
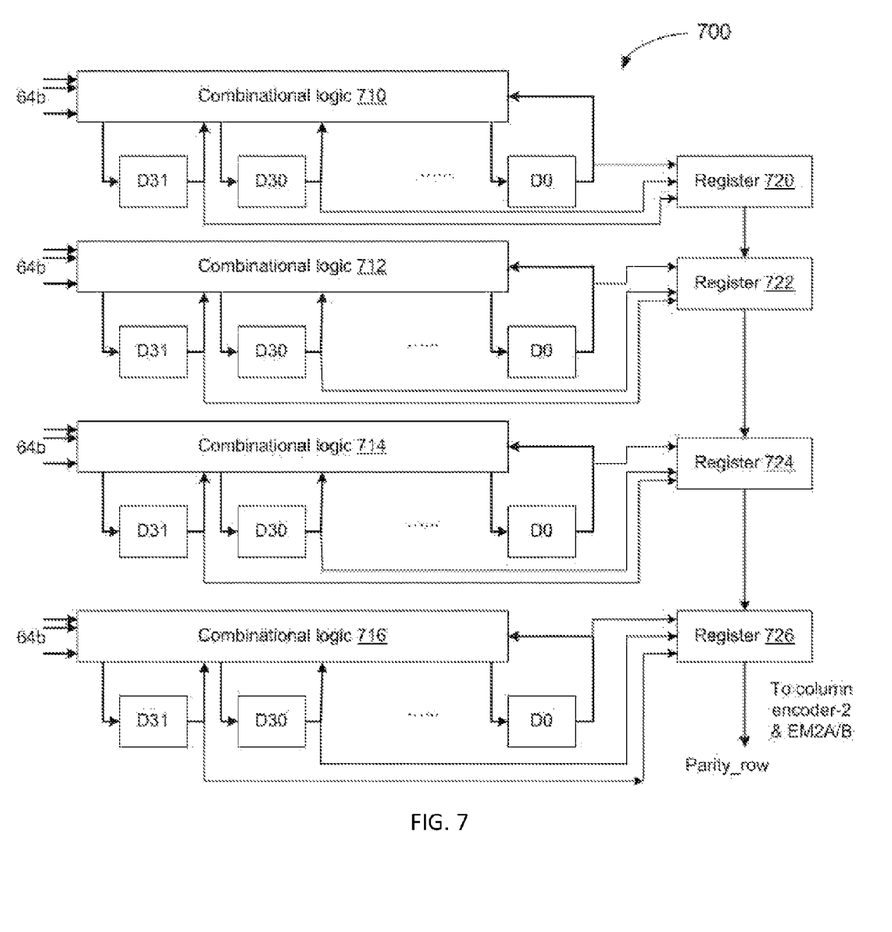
FIG. 7 shows one embodiment of a row encoder of the disclosed encoder.

FIG. 7 shows one embodiment of a row encoder 700. The row encoder 700 includes a plurality of combinational logics 710, 712, 714, and 716. Each combinational logics 710, 712, 714, and 716 respectively takes input from T bits of input data and respectively outputs P bits of row parity bits. Each combinational logics 710, 712, 714, and 716 is also connected to a plurality of delay units D. At the end of each encoding of a row code, the state of each row encoder, which is the row parity bits 472 illustrated in FIG. 3, is copied to corresponding registers 720, 722, 724, and 726. The four registers 720, 722, 724, and 726 form a FIFO and pump out the data to column encoder-2 as well as encode memory 2A/2B (EM2A/EM2B). In this example, the row encoder 700 has 4 combinational logics each having 32 delay units and outputs 32 parity bits to 4 registers. These number parameters may be changed appropriately if necessary. For example, the row encoder 700 may have 8 combinational logics each having 32 delay units and outputs 32 parity bits to 8 registers.

Figure 8:
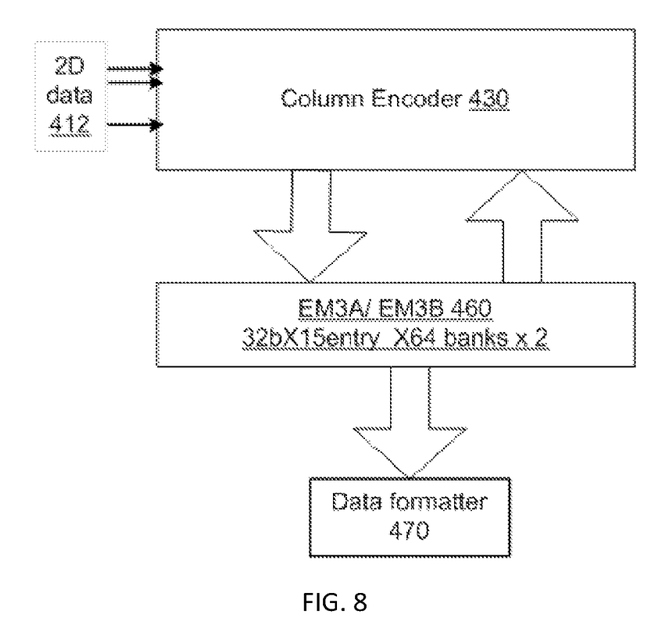
FIG. 8 shows the column encoder with data formatter according to one embodiment of the encoder of FIG. 4.

FIG. 8 shows the column encoder 430 with data formatter 470 according to one embodiment of the encoder of FIG. 4. The column encoder 430 takes input from two dimensional data 412 and updates column parity bits until the whole column of source data processed by the column encoder 430. At the end of encoding each column, the column encoder 430 outputs Q bits of column parity bits. During the updating process, the column encoder 430 interacts with memory EM3A/EM3B 460. The formatter 470 is used to convert the computed column code parity bits that are stored in memory column-wise, which corresponds to parallel column parity bits 474 in FIG. 4, into a data stream of 256 bits per cycle, corresponding to 256 different column codes in a serial column parity bits 476 in FIG. 4. One way to implement the data formatter 470 is to perform the process in 2 steps. In the first step, we output 256 bits per cycle from EM3A or EM3B (depends on even frame or odd frame). In this case, one way is to output 4 bits from each of 64 memory banks for the corresponding memory (EM2A or EM3B). In one example, the output from the first step is an array of data of 64×4 bits as shown in FIG. 7. In the second step, we use register-based circuitry (registers, multiplexers, and control logic) to convert 64×4 bits data stream into 1×256 bits data stream, which is similar to a reverse process of data formatter 410 in FIG. 4.

One embodiment of the memory EM3A/EM3B 460 includes two ping-pong memories or two register files EM3A and EM3B each has 64 memory banks. Each of the 64 memory banks has 15 memory entries that have 32 bits in each memory entry. The output sequence is as follows: for the first 15 cycles, the memory EM3A/EM3B 460 outputs 4 most significant bits of the i-th data entry at i-th cycle (i=0, 1, 2, . . . , 14) from each of 64 memory banks. In second 15 cycles, the memory EM3A/EM3B 460 outputs 2nd 4 most significant bits of the i-th (i=0, 1, 2, . . . , 14) data entry from each of 64 memory banks, et al. In this embodiment, the corresponding encoder only needs less than 120 cycles to output all column code parity bits in one encoded data frame.

There are other similar ways to store iteratively computed column code parity bits. For instance, the memory EM3A/EM3B 460 may have 16 (instead of 64) memory banks with each bank contains 15 entries and each entry has 128 (instead of 32) bits. Accordingly, in the first step, data formatter 470 outputs 16 bits per memory banks and these 16 bits consist of 4 groups and each group has 4 bits.

Figure 9:
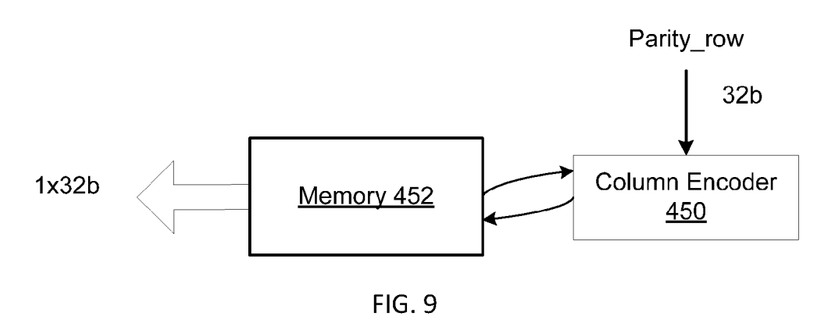
FIG. 9 shows an embodiment of column encoder of the disclosed encoder.

FIG. 9 shows an embodiment of column encoder 450 that works in a similar way as column encoder 430. One of the differences is that column encoder 450 has 32 parallel component encoders and each encoder gets 1 bit input once a while. The intermediate result is stored in a memory 452 such as ping-pong memories or ping-pong register files. In some embodiments, it is better to store in ping-pong register files because we can reuse the register file to convert the data in format of 1×32b into 32×1b. In this embodiment, there are only 31 rows for the column parity bits part. We use 32 bit entry because the extra space may be used to store the 96 spare bits of SP-BCH code.

Figure 10:
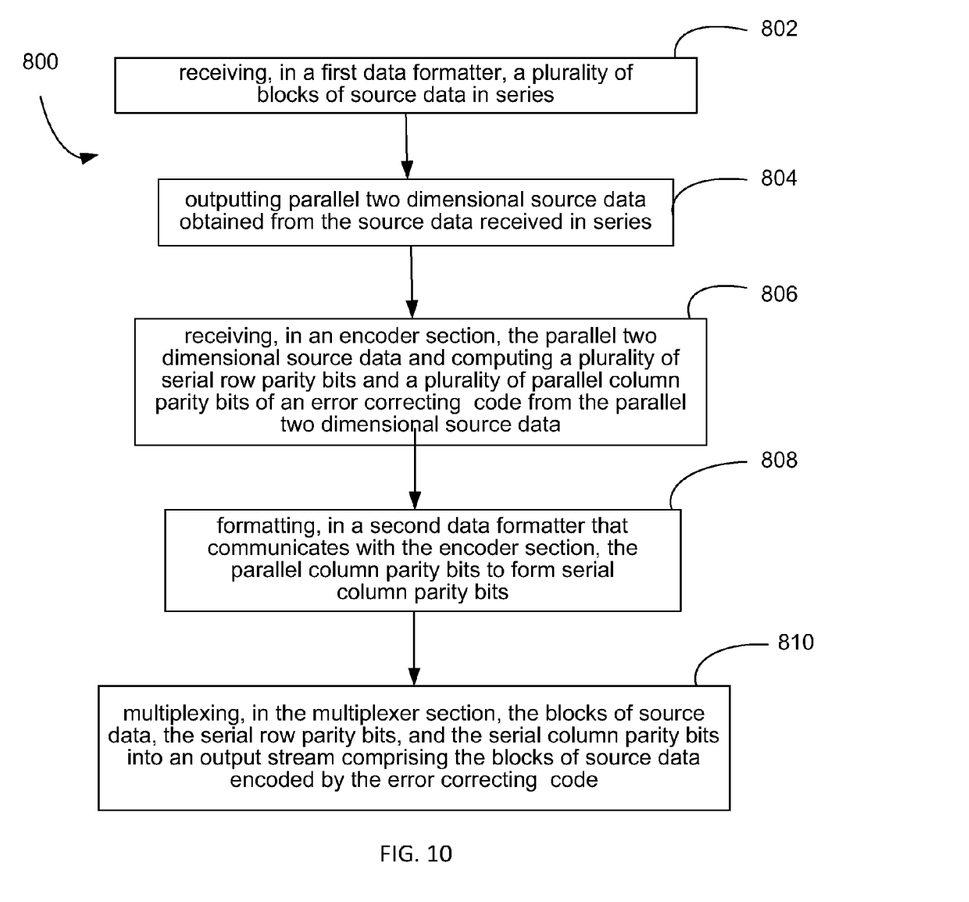
FIG. 10 shows an exemplary method implemented with one embodiment of the disclosed encoder.

FIG. 10 shows an exemplary method 800 implemented with one embodiment of the encoder 400. In step 802, the first data formatter 410 receives a plurality of source data blocks Bn in series. In step 804, the first data formatter 410 then outputs parallel two dimensional source data 412 obtained from the source data received in series. In step 806, the encoder section 420 receives the parallel two dimensional source data 412 and computes a plurality of serial row parity bits 472 and a plurality of parallel column parity bits 474 of an error correcting code. In step 808, the second data formatter 470 communicates with the encoder section 420 and formats the parallel column parity bits 474 to form serial column parity bits 476. In step 810, the multiplexer section 480 multiplexes the blocks of source data Bn, the serial row parity bits 472, and the serial column parity bits 478 into an output stream 490 including the blocks of source data encoded by the error correcting code. The disclosed method is for illustration only, and the disclosed method may be implemented differently without departing from the spirit of the disclosure.

The methods, devices, and logic described above may be implemented in many different ways in many different combinations of hardware, software or both hardware and software. For example, all or parts of the encoder may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits. All or part of the encoder described above may be implemented as instructions for execution by a processor, controller, or other processing device and may be stored in a tangible or non-transitory machine-readable or computer-readable medium such as flash memory, random access memory (RAM) or read only memory (ROM), erasable programmable read only memory (EPROM) or other machine-readable medium such as a compact disc read only memory (CDROM), or magnetic or optical disk. Thus, a product, such as a computer program product, may include a storage medium and computer readable instructions stored on the medium, which when executed in an endpoint, computer system, or other device, cause the device to perform operations according to any of the description above.

The processing capability of the encoder may be distributed among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many ways, including data structures such as linked lists, hash tables, or implicit storage mechanisms. Programs may be parts (e.g., subroutines) of a single program, separate programs, distributed across several memories and processors, or implemented in many different ways, such as in a library, such as a shared library (e.g., a dynamic link library (DLL)). The DLL, for example, may store code that performs any of the system processing described above. While various embodiments of the disclosure have been described, it will be apparent to those of ordinary skill in the art that many more embodiments and implementations are possible within the scope of the disclosure. Accordingly, the disclosure is not to be restricted except in light of the attached claims and their equivalents.

What is claimed is:

1. A data encoding circuit comprising:
   a first data formatter configured to output a source data block comprising rows and columns in parallel;
   an encoder section configured to receive the rows and columns, the encoder section comprising: first column encoders and row encoders configured to work in parallel with the first column encoders to generate column parity bits and row parity bits;
   a multiplexer section configured to multiplex the source data, the row parity bits, and the column parity bits into an output stream; and multiple pipeline registers configured to receive the row parity bits from the row encoders and output the row parity bits to second column encoders following the pipeline registers.

2. The data encoding circuit of claim 1, further comprising alternately accessed memories configured to receive the column parity bits from the column encoders.

3. The data encoding circuit of claim 2, where the alternately access memories are configured to alternate between a first processing mode when encoding a first frame, and a second processing mode when encoding a second frame consecutive with the first frame.

4. The data encoding circuit of claim 2, where:
the alternately accessed memories are configured to alternate between a first processing mode when encoding a first frame and a second processing mode when encoding a second frame consecutive with the first frame;
the first mode comprises a column encoding mode for the first frame; and
the second mode comprises an output mode for outputting encoded data of the first frame.

5. The data encoding circuit of claim 1, where the second column encoders are configured to receive the row parity bits from the pipeline registers and generate parity of parity bits.

6. The data encoding circuit of claim 5, where the first data formatter comprises register arrays configured to buffer at least (S-1) full rows of source data in the register arrays before outputting the source data block including S rows and T columns.

7. The data encoding circuit of claim 1, where the multiplexer section comprises a source data memory and a column parity bit memory.

8. The data encoding circuit of claim 7, wherein the multiplexer section further comprises a first multiplexer configured to select between the source data memory and the column parity memory.

9. The data encoding circuit of claim 8, where the multiplexer section comprises a second multiplexer configured to select between the first multiplexer and the row parity bits.

10. A data encoding method comprising:
receiving source data and outputting a source data bock comprising S rows and T columns in parallel;
receiving the rows and columns by row encoders and first column encoders working in parallel with the row encoders;
generating first column parity bits with first column encoders; and
generating row parity bits with row encoders and outputting the row parity bits to second column encoders via pipeline registers;
multiplexing the source data, the row parity bits, and the first column parity bits into an output stream: and
writing second column parity bits from the second column encoders into alternately accessed memories.

11. The method of claim 10, further comprising writing the second column parity bits from the second column encoders into the alternately accessed memories when encoding two consecutive frames.

12. The method of claim 10, further comprising serializing the row parity bits output by the row encoders with the pipeline registers.

13. The method of claim 12, further comprising:
generating parity of parity bits using the second column encoders.

14. The method of claim 10, further comprising generating parity of parity bits with the second column encoders.

15. The method of claim 10, further comprising storing the source data in a source data memory and storing the column parity bits in a column parity bit memory.

16. The method of claim 15, where multiplexing includes first multiplexing between the source data memory and the column parity memory.

17. The method of claim 16, where multiplexing further comprises second multiplexing between an output of the first multiplexing and the row parity bits.

18. A system for encoding a plurality of frames of source data, each frame of source data comprising M rows and N columns, the system comprising:
a first data formatter configured to serially receive blocks of W bits of source data and output two dimensional source data in S rows and T columns in parallel, where $W=S*T$;
an encoder section in communication with the first data formatter, the encoder section comprising a plurality of row encoders and first column encoders configured to work in parallel with each other to encode each row and column of the two dimensional source data and generate serial row parity bits and parallel column parity bits;
second column encoders configured to receive the serial row parity bits via pipeline registers and generate parity of parity bits; and
a multiplexer section configured to multiplex the source data, the row parity bits, and the column parity bits into an encoded output stream.

19. The system of claim 18, further comprising:
a second data formatter in communication with the encoder section and configured to receive the parallel column parity bits and output in response serial column parity bits; and
ping-pong memories connected to the column encoders and configured to receive the column parity bits from the column encoders and alternate between a first processing mode when encoding a first frame and a second processing mode when encoding a second frame consecutive with the first frame.

20. The system of claim 18, where the encoder section comprises S row encoders operating in parallel and T first column encoders operating in parallel.

21. The system of claim 20, further comprising alternately accessed memories store the parallel column parity bits, where the pipeline registers are configured to store the row parity bits.

22. The system of claim 21, where:
the alternately accessed memories are configured to alternate between a first processing mode when encoding a first frame and a second processing mode when encoding a second frame consecutive with the first frame;
the first mode comprises a column encoding mode for the first frame; and
the second mode comprises an output mode for outputting encoded data of the first frame.

* * * * *